United States Patent [19]
Kondou

[11] Patent Number: 5,317,188
[45] Date of Patent: May 31, 1994

[54] MEANS FOR AND METHODS OF TESTING AUTOMATED TAPE BONDED SEMICONDUCTOR DEVICES

[75] Inventor: Kenji Kondou, Tokyo, Japan
[73] Assignee: NEC Corporation, Japan
[21] Appl. No.: 874,628
[22] Filed: Apr. 27, 1992
[30] Foreign Application Priority Data
Apr. 30, 1990 [JP] Japan ................. 3-128570
[51] Int. Cl.⁵ ............... H01L 23/48; H01L 29/44; H01L 29/52; H01L 29/60
[52] U.S. Cl. .................. 257/668; 257/666; 257/698; 257/48
[58] Field of Search ............ 257/671, 672, 668, 698, 257/692, 691, 701, 702, 666, 48

[56] References Cited
U.S. PATENT DOCUMENTS
5,065,227 11/1991 Frankeny et al. ............. 257/698

Primary Examiner—Sheila V. Clark
Attorney, Agent, or Firm—Laff, Whitesel, Conte & Saret

[57] ABSTRACT

A semiconductor device produced by a TAB method is provided which comprises a carrier tape section having a device hole, a first wiring layer formed on one surface of a tape section to be used for assembling the semiconductor device, a semiconductor chip retained in the device-hole electrically connected the first wiring layer, and a second wiring layer formed on the other surface of the tape section for electrically connecting the first wiring layer of the semiconductor device to the first wiring layer of a semiconductor device adjacently disposed thereto before being cut. By clamping the tape section on the widthwise sides with an electroconductive member pair electrically connected to each other, the first and second wiring layers are electrically connected. By disposing the electroconductive member pair in such a manner that is shown above to each of a plurality of semiconductor devices formed on the tape, these semiconductor devices can be electrically connected to the second wiring layer. By applying an electric signal for testing through the second wiring layer to the plurality of semiconductor devices, these devices can be test under such a state that is being formed on the carrier tape. It is preferable to electrically connect the first wiring layer to second wiring layer through through-holes formed in the tape.

14 Claims, 6 Drawing Sheets

MEANS FOR AND METHODS OF TESTING AUTOMATED TAPE BONDED SEMICONDUCTOR DEVICES

BACKGROUND OF THE INVENTION

1. Field of the Invention

This invention relates to a semiconductor device produced by a tape automated bonding (TAB) method and its testing method and an apparatus to be used therefor.

2. Description of the Prior Art

A conventional semiconductor device produced by the TAB method (hereinafter called TAB semiconductor device) is illustrated in FIG. 1, which shows the state a before separation of a plurality of semiconductor elements formed on a carrier tape.

In FIG. 1, a carrier tape 21 of a synthetic resin film has a plurality of sprocket holes 22 perforated serially at the edges and along the the length thereof. The sprocket holes 22 are engaged by sprocket teeth which run the tape 21. The tape 21 also has a plurality of device-holes 23 disposed at a predetermined spaced intervals centrally in the lengthwise direction thereof. Each of the holes 23 has a semiconductor chip 24 disposed therein. On the surface of the tape 21, a wiring layer forming four sets of wiring lines 25A, 25B, 25C and 25D and four sets of external terminals 26A, 26B, 26C and 26D are patterned for each of the device holes 23. The semiconductor chip 24 is electrically connected to each set of the wiring lines 25A, 25B, 25C and 25D via innerleads respectively provided on these wiring lines, and retained into the device-hole 23. Each set of the wiring lines 25A, 25B, 25C and 25D consists of five lines.

A conventional semiconductor element B is formed by cutting the carrier tape 21 in a unit including the device hole 23, the semiconductor chip 24 in each device hole 23, four sets of the wiring lines 25A, 25B, 25C and 25D and four sets of the external terminals 26A, 26B, 26C and 26D which are patterned around each of the device holes 23. The TAB method produces this type of semiconductor element B is produced continuously on the carrier tape 21. Namely, the carrier tape 21 having a plurality of sprocket holes 22, a plurality of device holes 23, a plurality of sets of wiring lines 25A, 25B, 25C and 25D and a plurality of sets of external terminals 26A, 26B, 26C and 26D repeats a stop and run process for successively bonding the semiconductor chip 24 to the inner-leads of each four sets of wiring lines 25A, 25B, 25C and 25D. As a result, the semiconductor chip 24 and the wiring lines 25A, 25B, 25C and 25D are electrically and mechanically connected to each other simultaneously. At the time when the bonding process is finished, a plurality of semiconductor elements B having the same structure are provided in parallel on the carrier tape 21 at predeterminedly spatially entervals along the length of the tape 21. The wiring lines 25A, 25B, 25C and 25D of each semiconductor element B are independent of those of the adjacent one, which means that the semiconductor elements B thus formed are electrically isolated from each other. The tape 21 thus having a plurality of semiconductor elements B is cut to provide separate device-hole unit.

The selection of the semiconductor elements formed on the carrier tape 21 is carried out as follows. First, the semiconductor elements B are electrically tested as a first selection process. This electrical test advantageously utilizes the continuity of devices as a feature of the TAB method in that it is carried out before the carrier tape 21 is cut, or while the tape is still joined.

Next, in order to screen initial defects, a burn-in test is carried out. This test is performed so that the carrier tape 21 is cut for separating the semiconductor elements B. The semiconductor elements B, thus separated, are individually inserted into sockets. This is based on the fact that a source voltage or input pulse for the testing purpose (hereinafter called "electric signal for testing") can not be applied simultaneously to all of the elements B because they are electrically isolated from each other.

Thereafter, the electrical test is carried out again for the semiconductor elements B thus burn-in tested as a second selection process. This test is carried out individually for each of the separated elements.

As explained above, the burn-in test is carried out conventionally after the carrier tape 21 has been cut to separating the elements. Thus, it is not possible to test the continuity of the elements as a feature of the TAB production method or, to give such an advantage that a plurality of semiconductor elements B can be continuously formed on a carrier tape. As a result, there arises such a problem that the TAB method is inferior in mass-productivity to the other methods.

This invention was made in consideration of the above-mentioned problem, and an object of this invention is to provide a TAB semiconductor device capable of improving mass-productivity by the TAB method by reducing the number of a steps to be carried out in the selection process and the other processes thereafter.

Another object of this invention is to provide a testing method of TAB semiconductor device and an apparatus to be used therefor, which is capable of improving mass-productivity by the TAB method.

SUMMARY OF THE INVENTION

In a first aspect of this invention, a TAB semiconductor device is provided which can be tested under the condition which is formed on a carrier tape. That is, the test can be performed before separating a plurality of semiconductor devices formed on the carrier tape.

A TAB semiconductor device of the first aspect comprises a carrier tape having a device-hole. Sets of first wiring layer lines are formed on a first surface of the tape. Semiconductor chip are retained in each devicehole and are electrically connected to the respective sets of the first wiring lines. Second wiring lines are formed on a second and opposite surface of the tape for electrically connecting the respective sets of the first wiring lines to each other.

In this TAB semiconductor device, for example, by clamping the tape widthwise on the widthwise sides with an electroconductive member pair which are electrically connected to each other, the respective sets of the first wiring lines formed on the first surface of the tape can be electrically connected to the second wiring lines formed on the second surface thereof. As a result, a plurality of semiconductor devices disposed in parallel on the carrier tape can be electrically connected to each other via the second wiring lines before separation by connecting the first and second wiring lines with the electroconductive member pairs used as shown above.

Accordingly, if a specific electric testing signal for testing is applied directly or through the electroconductive member pairs to the second wiring lines, the plurality of semiconductor elements are applied with the specific electric signal simultaneously, so that these semiconductor devices can be tested simultaneously. This means that the selection test can be carried out before separation as compared with the prior art in which it is carried out after separation, so that the number of steps to be carried out in the selection process and the processes thereafter can be reduced. Consequently, mass-production of TAB semiconductor devices can be improved.

The second wiring lines are preferably equal in the number of each set of the first wiring lines.

In the preferred embodiment, this semiconductor device makes each set of the first wiring lines electrically connectable to the second wiring lines through the through-holes formed in the tape. As a result, by providing electroconductive material respectively insertedly into the through-holes, the first and second wiring lines can be electrically connected to each other easily and stably. In this case, the through-holes each first is perforated for each wiring lines, and the second wiring lines are equal in the number to each set of the first wiring lines.

In addition, the second wiring lines and through-holes can be easily formed on and in the carrier tape by a known method.

In a second aspect of this invention, a method of testing a TAB semiconductor device is provided, which is formed on a carrier tape having a plurality of device-holes and a plurality of sets of first wiring lines formed for every device on a first surface of the carrier tape to be used for assembling the TAB semiconductor device. On a second surface of the carrier tape, second wiring lines are formed in order to electrically connect the first wiring lines of the semiconductor device respectively to the first wiring lines of a semiconductor device adjacently disposed thereto. After electrically connecting the first and second wiring lines to each other with any connecting means, a plurality of semiconductor devices formed on the carrier tape are applied with an electric signal for testing.

According to this method, a plurality of semiconductor devices formed on the carrier tape can be simultaneously tested for selection. As a result, there does not need to separate them individually for testing as in the prior art, thus making it possible to reduce the number of steps to be carried out not only in the selection process but also in any other processes thereafter. This means that mass-productivity of TAB semiconductor devices can be improved.

The electric signal for testing may be applied by contacting a contact menberor members of any electric signal supplying source directly to the second wiring lines, or from the electric signal supplying source through the connecting means to the second wiring lines.

This testing method is preferable that through-holes are formed in the carrier tape thereby electrically connecting the first wiring lines to the second wiring lines therethrough respectively, which means that the first and second wiring lines can be easily and stably connected to each other, thus being capable of advantageously making the connecting means simple in structure.

The through-hole is preferable to be formed for each of the first wiring lines, and the second wiring lines are preferable to be equal in the number of lines to the first wiring lines.

The connecting means may be sufficiently used if it can electrically connect the first and second wiring lines to each other. For example, it can be made simply of an electroconductive member pair electrically connectable to each other and clamp the carrier tape on the widthwise sides thereof. The electroconductive member pair is preferable that one member has an electroconductive contact portion capable of passing through the through-hole and the other member has a shape capable of being fittedly engaged with the contact portion thus passed therethrough.

In a third aspect of this invention, an apparatus adapted to be used for testing the TAB semiconductor device shown in the second aspect is provided.

The apparatus to be used for testing of this aspect comprises a first member having a first electroconductive contact portion to be electrically connected to the first wiring lines of the carrier tape, and a second member having a second electroconductive contact portion electrically connectable to the first contact portion for electrically connecting the first wiring lines to the second wiring lines on the carrier tape.

With the apparatus of this aspect, the first and second members of the apparatus are disposed so as to held the carrier tape therebetween thereby to contact the first contact portion of the first member to the first wiring lines and the second contact portion of the second member to the second wiring lines, so that the first and second wiring lines of the carrier tape can be electrically connected through the first and second contact portions to each other. As a result, if an electric signal for testing is applied to the second wiring lines either directly by contacting a contact member or members of any electric signal source with the second wiring lines, or indirectly through the first or second contact portion from the any electric signal source, a plurality of semiconductor devices formed on the carrier tape can be applied with the electric signal for testing simultaneously. As a result, these semiconductor devices can be tested simultaneously with no need to be cut prior to the test.

The first electroconductive contact portion is generally structured so as to be connected with only one set of the first wiring lines for one semiconductor device on the tape. However, it may be structured so as to be connected with two or more sets of the first wiring lines.

The first and second contact portions may be directly connected to each other through the through-holes formed as shown in the first and second aspects or indirectly connected to each other using lead lines passing externally of the tape.

In the case that the carrier tape has through-holes perforated, it is preferable that one of the first and second contact portions is formed of pin-shape capable of passing through the through-hole and the other thereof has a recess capable of being fittedly engaged with the pin-shaped portion. Thus, if the tape is clamped between the first and second members, the first and second electroconductive portions are connected to the first and second wiring lines, respectively, resulting in electrically connecting the first and second wiring lines to each other. This means that there does not need to electrically connect the first and second contact portions individually using lead lines or the like.

The first and second contact portions are preferable to be locked so that such state can be retained after fittedly engagement. Thus, the first and second members can be easily retained in contact with each other, thus being capable of advantageously eliminating use of any other locking means.

The apparatus for testing of this aspect is preferable that the first and second members are pivotally coupled about a shaft and structured to clamp the tape on the widthwise sides thereof. This means that only by clamping the tape by pivotally operating one of the first and second members, the first and second wiring lines can be made in electrical connection with each other.

The apparatus of this aspect is preferable that one of the first and second electroconductive contact portions has means such as a lead wire or the like for supplying an electric signal for testing. In this case, an electric signal for testing can be supplied through the apparatus to each semiconductor device.

In a fourth aspect of this invention, a semiconductor device including a semiconductor chip disposed in each of a plurality of device-holes formed on one surface of a carrier tape at a predetermined interval of space centrally in the lengthwise direction thereof is provided.

This semiconductor device includes a plurality of sets of first wiring lines formed on a first surface of a carrier tape for every device-hole to be used for assembling the semiconductor device, and second wiring lines formed on a second surface of the carrier tape to be used for electrically connecting the sets of the first wiring lines in a set-to-set manner each other.

The carrier tape is preferable to have through-holes passing therethrough thereby electrically connecting the first wiring lines of each set to the second wiring lines.

DESCRIPTION OF THE PREFERRED EMBODIMENTS

The preferred embodiment of this invention will be described below while referring to FIGS. 2 through 7.

SEMICONDUCTOR DEVICE

Figure 1:
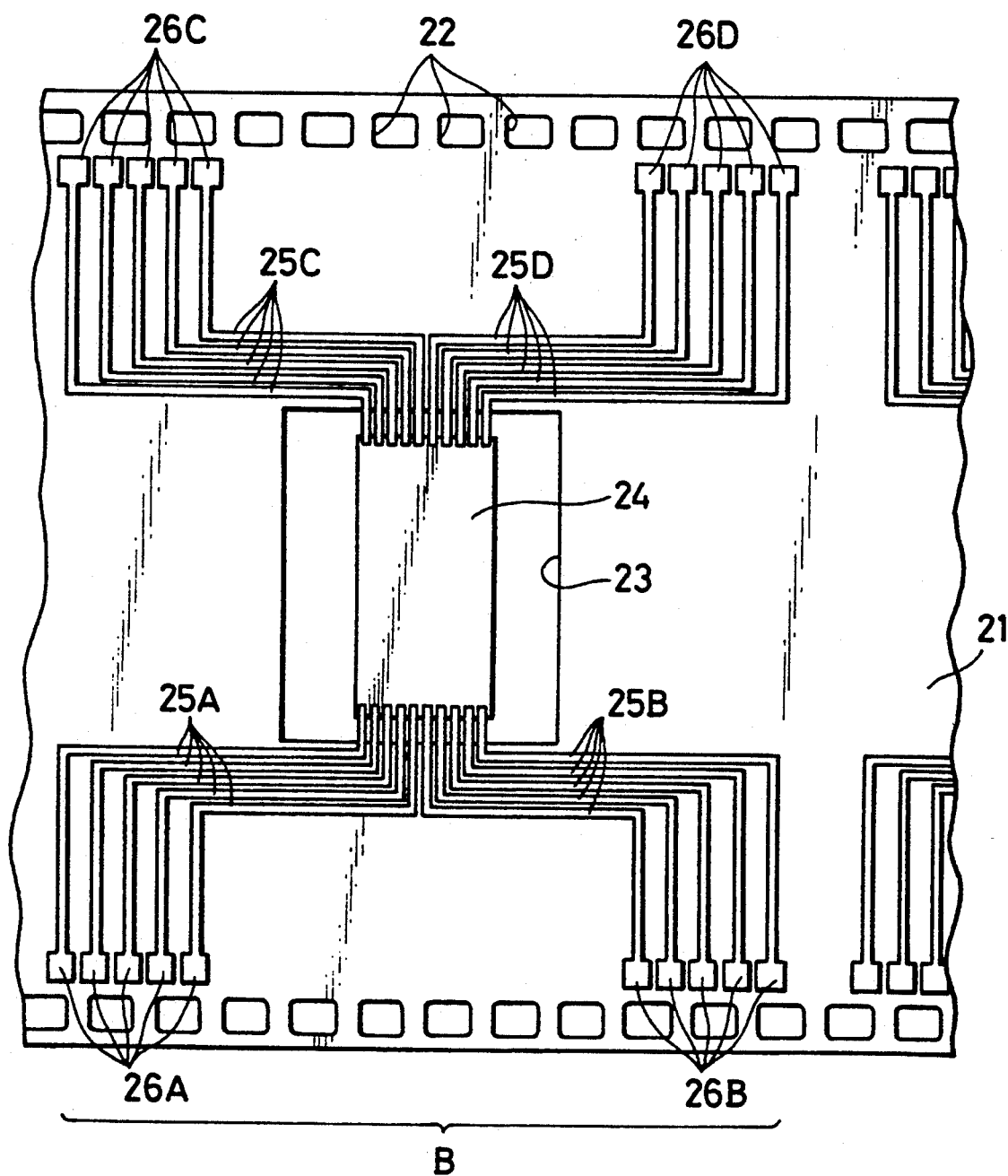
FIG. 1 is a top view of a conventional TAB semiconductor device.
Figure 2:
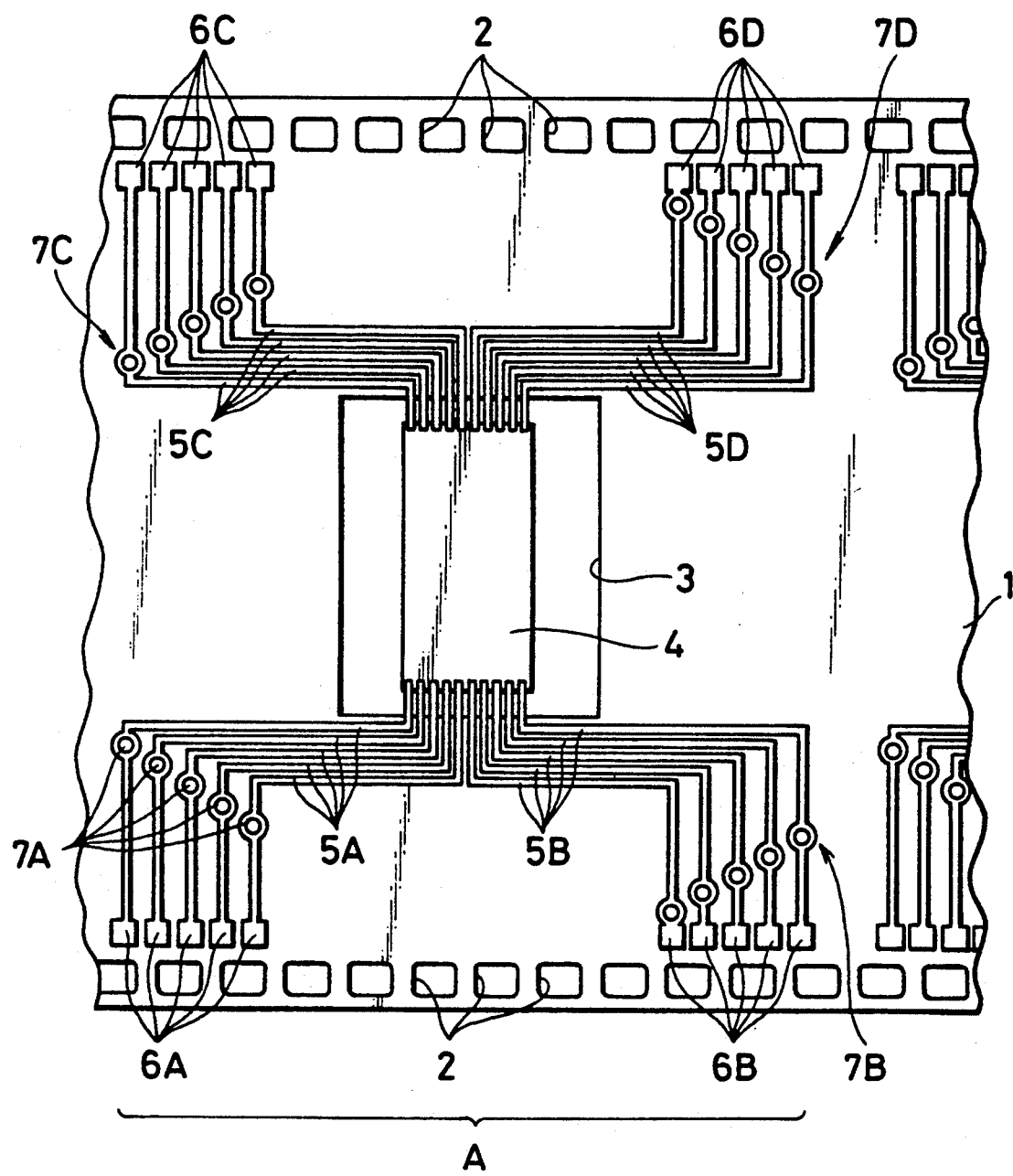
FIG. 2 is a top view of a TAB semiconductor device according to one embodiment of this invention.
Figure 3:
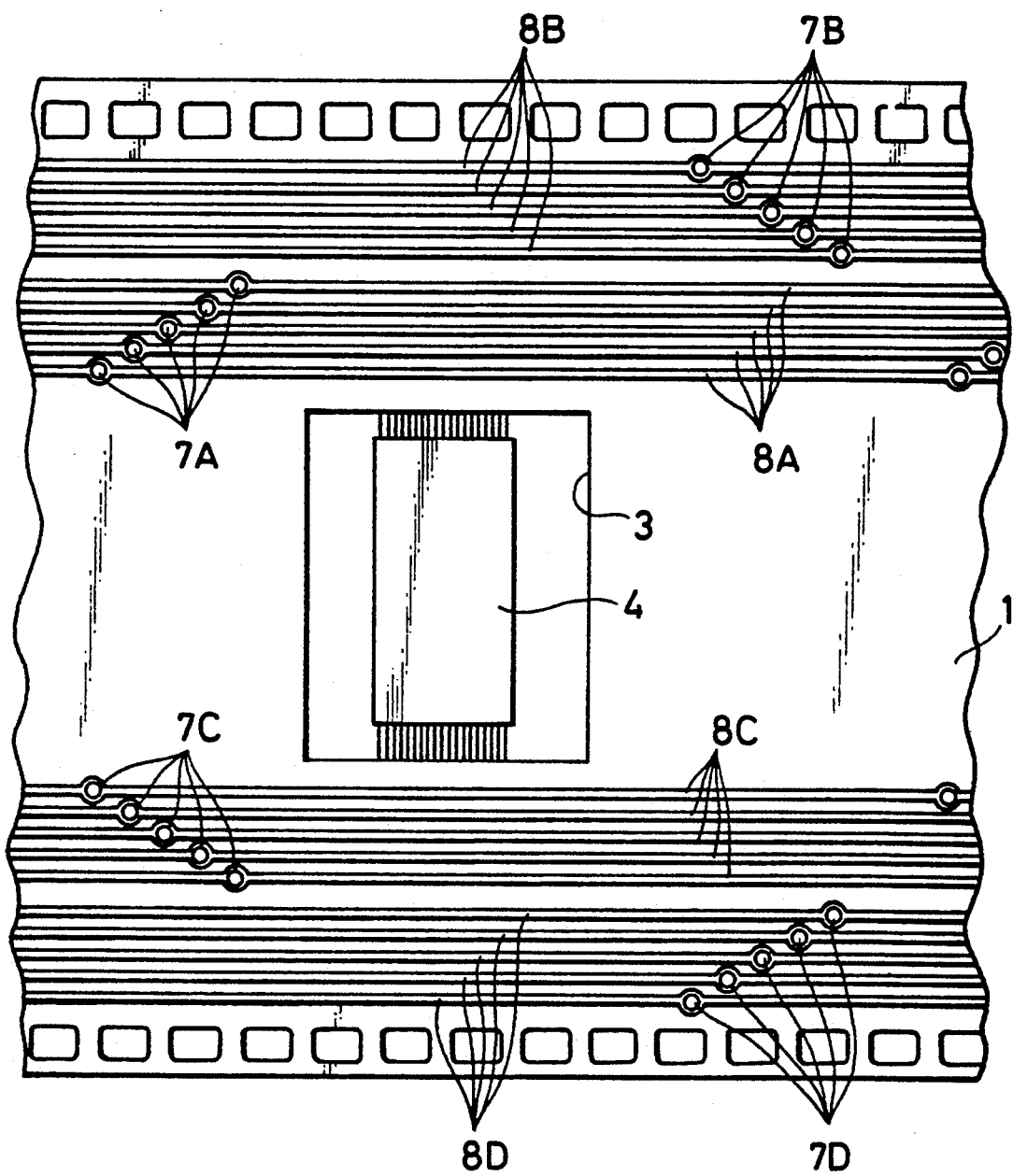
FIG. 3 is a bottom view of the TAB semiconductor device shown in FIG. 2.

A TAB semiconductor device according to one embodiment of this invention is shown in FIGS. 2 and 3, which illustrate the state before individually separating a plurality of semiconductor elements formed on a carrier tape.

In FIGS. 2 and 3, a carrier tape 1 of a synthetic resin film has a plurality of sprocket holes 2 serially formed at each edge along the length thereof. In addition, the carrier tape 1 has a plurality of device holes 3 predeterminedly disposed spatially and along centrally the length thereof. Each device hole 3 has a semiconductor chip 4 disposed therein. On the front surface of the carrier tape 1 are formed a first wiring layer forming four sets of wiring lines 5A, 5B, 5C and 5D and four sets of external terminals 6A, 6B, 6C and 6D which are patterned for each device hole 3. Here, each set of the wiring lines 5A, 5B, 5C and 5D consists of five lines and is electrically connected to the semiconductor chip 4 through the corresponding one of inner-leads thereof, thus being retained in the device hole 3.

The wiring lines 5A, 5B, 5C and 5D respectively have through-holes 7A, 7B, 7C and 7D perforated through the tape 1 at predetermined positions on the lines.

On the back surface of the tape 1 is formed a second wiring layer forming four sets of wiring lines 8A, 8B, 8C and 8D patterned to extend along the length thereof. Each set of the wiring lines 8A, 8B, 8C and 8D consists of five straight lines parallel to each other. The five parallel straight lines 8A, 8B, 8C and 8D of the second wiring layer can be electrically connected through the through-holes 7A, 7B, 7C and 7D in a one-to-one corresponding manner to the wiring lines 5A, 5B, 5C and 5D formed on the front surface thereof, respectively. This electrical connection therebetween is made possible by providing electroconductive members insertedly into the through-holes 7A, 7B, 7C and 7D.

Each semiconductor element A of the TAB semiconductor device of this invention is formed of the semiconductor chip 4 disposed in the device hole 3, one set of the wiring lines 5A, 5B, 5C and 5D and one set of the external terminals 6A, 6B, 6C and 6D which are patterned on the front surface of the tape 1. In addition, it includes one set of the wiring lines 8A, 8B, 8C and 8D (strictly speaking, a part of them) formed on the back surface thereof.

The semiconductor elements A structured as above are produced in such a continuous manner by the TAB method that would be carried out for producing the semiconductor elements B of the prior art. After finishing the bonding process of the semiconductor chips 4 in the device holes 3, a plurality of the semiconductor elements A having the same structure are disposed on the tape 1 at a predetermined spaced interval along the length thereof, as shown in FIG. 2. In this case, the wiring lines 5A, 5B, 5C and 5D of each element A are respectively independent of those of the adjacent one, and at the same time, each set of the wiring lines 5A, 5B, 5C and 5D themselves are electrically isolated from each other. Finally, the plurality of semiconductor elements A thus formed on the tape 1 are separated individually by cutting the tape 1 in a device hole unit.

TESTING APPARATUS

Figure 5:
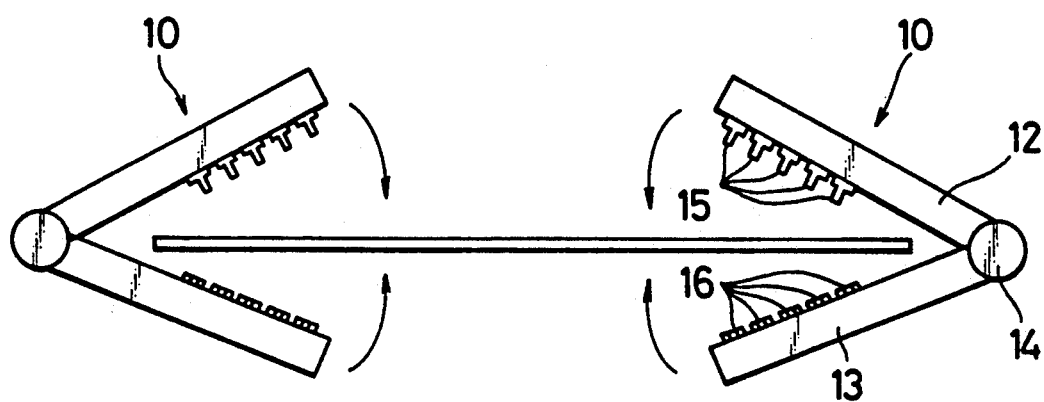
FIG. 5 is a view for explaining a using state of a testing apparatus according to a first embodiment of this invention.
Figure 6:
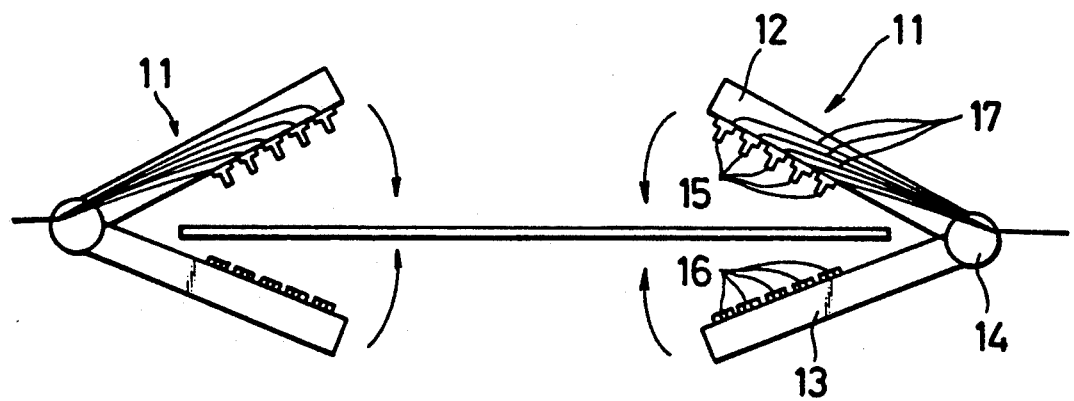
FIG. 6 is a view for explaining a using state of a testing apparatus according to a second embodiment of this invention.

Next, the apparatus to be used for testing the semiconductor device of this invention will be explained below by referring to FIGS. 5 and 6, in which FIG. 5 shows a using state of an apparatus of a first embodiment of this invention, and FIG. 6 shows a using state of an apparatus of a second embodiment thereof.

As shown in FIG. 5, a testing apparatus 10 of the first embodiment has a first member 12 to be disposed on the front surface side of the carrier tape 1 on which the wiring lines 5A, 5B, 5C and 5D are formed, and a second member 13 to be disposed on the back surface side thereof on which the wiring layers 8A, 8B, 8C and 8D are formed. The first and second members 12 and 13 are pivotally supported by a supporting shaft 14 which is provided at the supporting end thereof.

On respective confronting surfaces of the first and second members 12 and 13 other are provided a plurality of convex contact portions 15 (in this embodiment, five portions), each of which is pin-shaped and made of an electroconductive material. A plurality of concave contact portions 16 (in this embodiment, five portions), each of which is made of an electroconductive material, has a recess to be fittedly engaged with the convex contact portions 15. The convex and concave contact portions 15 and 16 are disposed confrontingly to be fittedly engaged with each other as shown above, so that when the first and second members 12 and 13 are pivotally moved so that the portions 15 and 16 come into contact with each other, the convex contact portions 15 of the first member 12 is fittedly engaged with the mating concave contact portions 16 of the second member 13. The convex and concave contact portions 15 and 16 are tightly fitted against each other, so that once engaged, they cannot be disengaged unless a tension force is applied. This means that the fitting state can be easily retained.

Figure 7:
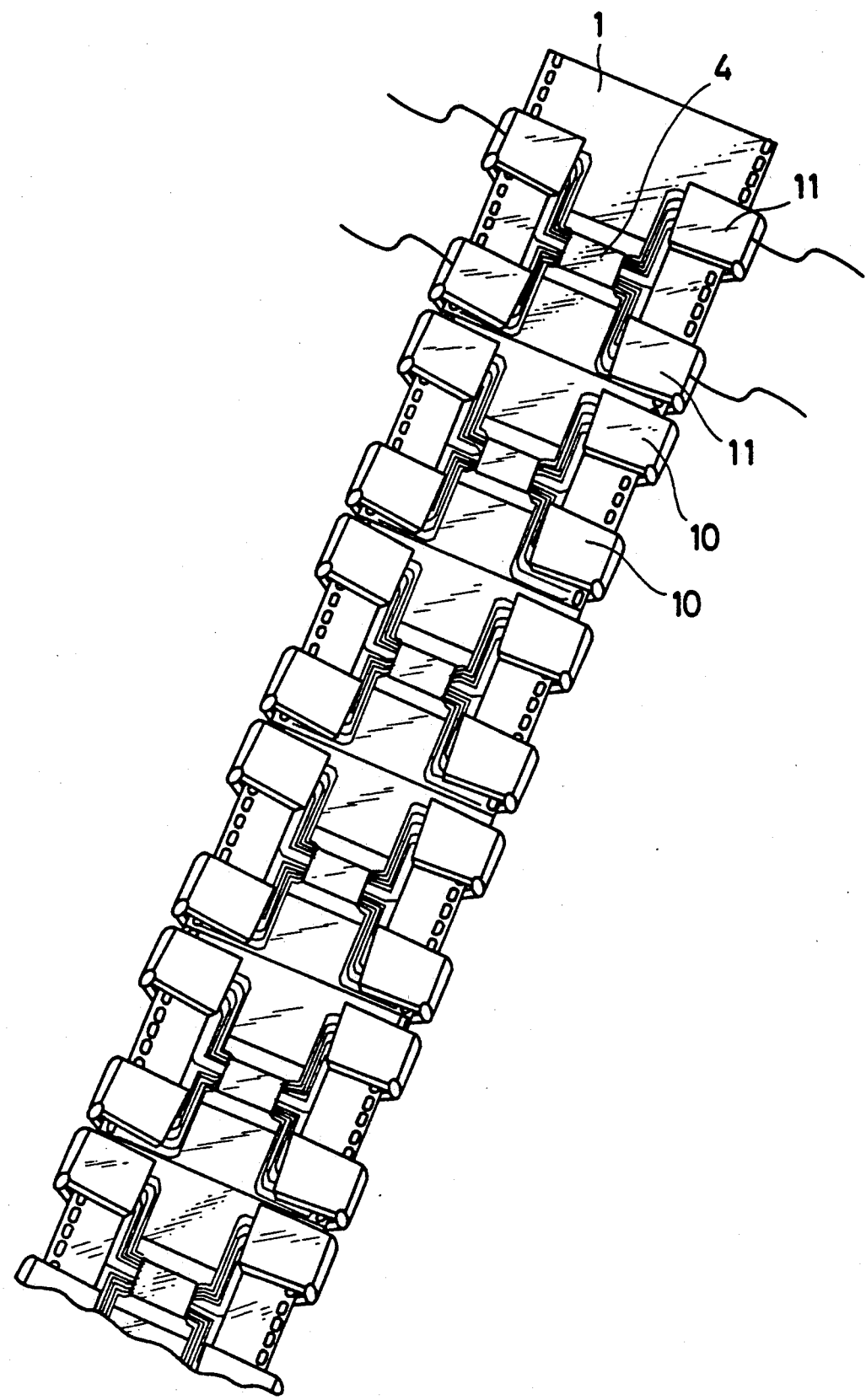
FIG. 7 is a perspective view showing a state of testing the semiconductor devices shown in FIG. 2 using the apparatus shown in FIGS. 5 and 6.

The testing apparatus 10 is structured so that each of the wiring lines 5A, 5B, 5C and 5D can be connected respectively to the corresponding one of the wiring lines 8A, 8B, 8C and 8D. As a result, as shown in FIG. 7, one semiconductor element A uses four testing apparatus 10. The convex and concave contact portions 15 and 16 of the testing apparatus 10 are to be arranged in accordance with the positional condition where it is used, or such a condition that it is used for any of the wiring lines 5A, 5B, 5C and 5D, because the wiring lines 5A, 5B, 5C and 5D are different in pattern form from each other and the through-holes 7A, 7B, 7C and 7D to be disposed correspondingly thereto are different in arrangement from each other.

Figure 4:
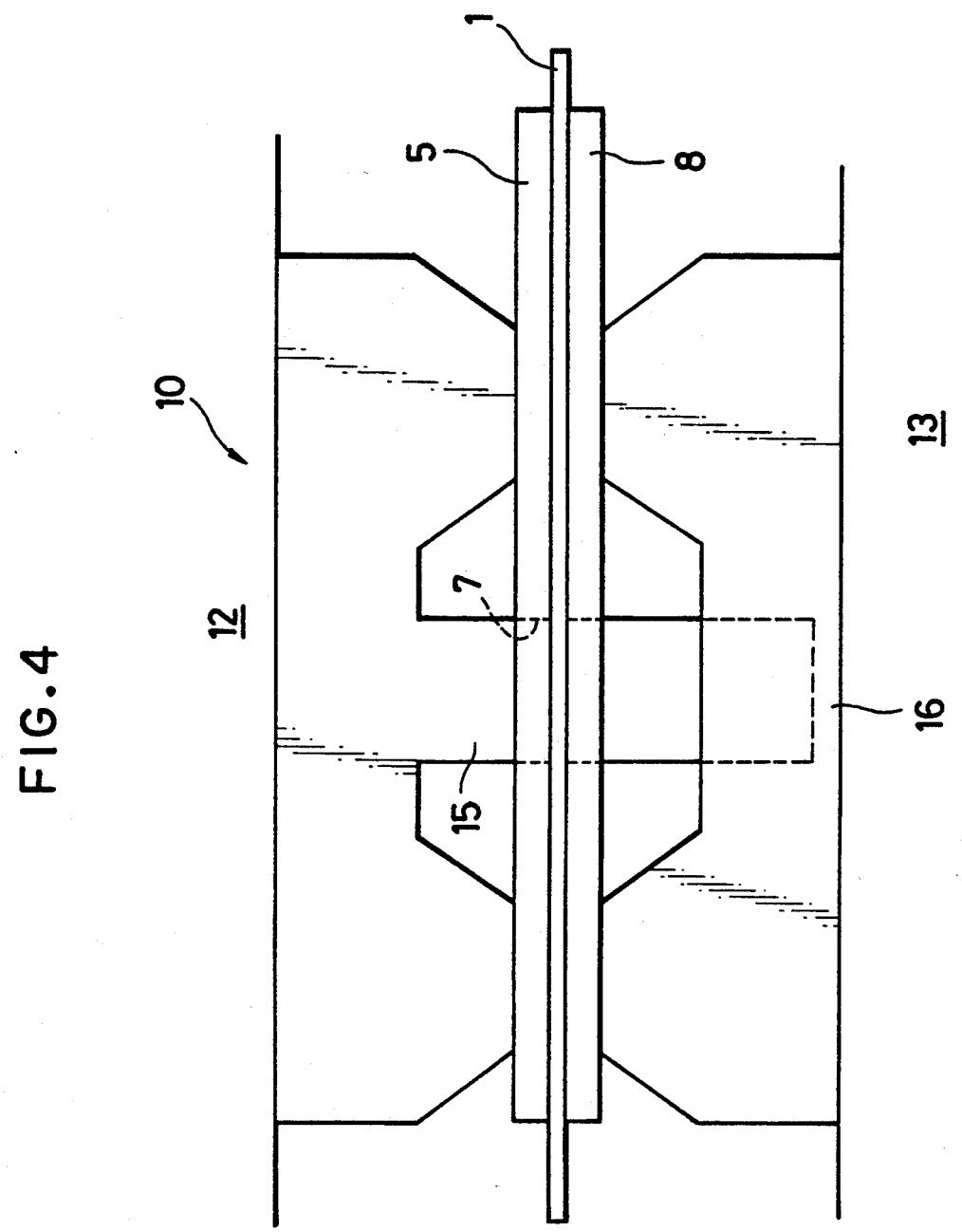
FIG. 4 is a schematically partially expanded view showing the state that the TAB semiconductor device shown in FIG. 2 is clamped by a testing apparatus according to this invention.

If the tape 1 is held between the first and second members 12 and 13, as shown in FIG. 5, the pin-shaped contact portion 15 of the first member 12 is passed through the corresponding through-hole to be fittedly engaged with the mating recess portion 16 of the second member 13. On the other hand, when the tape is held therebetween as above, the portions 15 are connected to any of the wiring lines 5A, 5B, 5C and 5D, and the portions 16 are contacted to the corresponding wiring lines 8A, 8B, 8C and 8D. As a result, the wiring lines 5A, 5B, 5C and 5D and the wiring lines 8A, 8B, 8C and 8D are electrically connected to each other in an one-to-one corresponding manner through the contact portions 15 and 16. This state is shown in FIG. 4, in which the wiring lines 5A, 5B, 5C and 5D patterned of the front surface of the tape 1, the wiring lines 8A, 8B, 8C and 8D formed on the back surface thereof and the through-holes 7A, 7B, 7C and 7D are generically indicated at 5, 8 and 7, respectively.

FIG. 6 shows a testing apparatus according to a second embodiment, in which a testing apparatus 11 has the same structure as that of the first embodiment excepting that the first member 12 of the apparatus 11 has the convex contact portions 15 each having a cable 17. With the testing apparatus 11, an electric signal to be used for testing such as, for example, a source voltage or pulse signal can be applied through the cables 17 respectively to the convex contact portions 15, thus being advantageous in that the testing signal can be supplied through the apparatus 11 to the semiconductor element A to be tested.

TESTING METHOD

Next, a selection test method of the TAB semiconductor devices thus prepared using the testing apparatus 10 and 11 structured as above will be explained below.

First, the apparatus 10 of the first embodiment is mounted to each set of the wiring lines 5A, 5B, 5C and 5D formed on the front surface of the carrier tape 1 (not yet cut). On the other hand, the apparatus 11 of the second embodiment is mounted to each set of the wiring lines 5A, 5B, 5C and 5D of a specific one of the semiconductor elements A to be tested. The apparatus 10 and 11 are so mounted thereto as shown in FIGS. 5 and 6 that the tape 1 is clamped widthwise by the first and second members 12 and 13 of the apparatus 10 and these of the apparatus 11, respectively, and the convex portions 15 of the first members 12 are fittedly engaged with the mating concave portions 16 of the second members 13. As a result, the wiring lines 5A, 5B, 5C and 5D of a plurality of semiconductor elements A to be tested are electrically connected respectively with each other through the wiring lines 8A, 8B, 8C and 8D, which is shown in FIG. 7.

Then, if a testing signal is applied to the semiconductor element A through the cables 17 of the four apparatus 11 specifically mounted thereto, the signal is fed to the semiconductor chip 4 through the wiring lines 8A, 8B, 8C and 8D and the wiring lines 5A, 5B, 5C and 5D. The semiconductor elements A to be tested respectively have the wiring lines 5A, 5B, 5C and 5D and the wiring lines 8A, 8B, 8C and 8D correspondingly connected to each other, which means that the same terminals of the semiconductor chip 4 of the semiconductor elements A to be tested are applied with the same electric signal simultaneously. As a result, all the chips 4 disposed on the tape 1 can be tested simultaneously.

As explained above, according to this invention, plural sets of the wiring lines independently formed on the front surface of the carrier tape 1 can be connected with each other in a corresponding one-to-one manner through the apparatuss 10 and 11 and the wiring lines provided on the back surface of the tape 1, so that the burn-in test can be achieved under the condition that the elements A are formed on the tape 1. This means that, as compared with the prior art, in which the burn-in test is carried out after separation, the number of steps to be carried out in the processes after the secondary selection test can be reduced, greatly contributing to an improvement in mass-productivity by the TAB method.

What is claimed is:
1. A semiconductor device, comprising:
   an elongated carrier tape having device-holes arranged at predetermined intervals along the length of said carrier tape;
   sets of first wiring lines formed on a first surface of said carrier tape, each set of said first wiring lines being individually associated with a corresponding one of said device-holes;
   a plurality of semiconductor chips, each of said chips being retained in an individually associated one of said device-holes, said semiconductor chips being electrically connected to said respective sets of said first wiring lines; and
   second wiring lines formed on a second surface of said carrier tape with said second wiring lines extending along said length of said carrier tape, said second surface being opposite to said first surface, and a number of said second wiring lines being at least the same as or larger than a number of said first wiring lines belonging to each set of said first wiring lines; and means for connecting each of said first wiring lines belonging to each set of said first wiring lines to be electrically connected to each of said second wiring lines via a connecting means so that an electrical testing signal can be simultaneously applied to all of said semiconductor chips.

2. A semiconductor device as claimed in claim 1, wherein said number of said second wiring lines is the same as said number of wires in each set of said first wiring lines.

3. A semiconductor device as claimed in claim 1, wherein said carrier tape has through-holes perforated therein, and each of said first wiring lines belonging to each set of said first wiring lines can be electrically connected to each of said second wiring lines via said through-holes by inserting said connecting means through said through-holes.

4. A semiconductor device as claimed in claim 3, wherein each of said through-holes is individually associated with a corresponding one of said first wiring lines, and each of said first wiring lines belonging to each set of said first wiring lines can be electrically connected to each of said second wiring lines via one of said individually associated through-holes.

5. A semiconductor device for use in an automated tape bonding production method including a carrier tape with device-holes formed therein at predetermined intervals along a length of said carrier tape, and semiconductor chips retained in individually associated ones of said device-holes, said carrier tape comprising:

a plurality of sets of first wiring lines formed on a first surface of said carrier tape, each set of said plurality of sets of said first wiring lines being electrically connected to a corresponding one of said semiconductor chips; and second wiring lines formed on a second surface of said carrier tape which is opposite to said first surface; and each of said first wiring lines belonging to each set of said first wiring lines being adapted to be electrically connected to each of said second wiring lines by a connecting means so that an electric signal may be applied simultaneously to all of said semiconductor chips.

6. A semiconductor device as claimed in claim 5, wherein said carrier tape has perforated through-holes therein, and each of said first wiring lines belonging to each set of said first wiring lines being positioned relative to said through-holes to enable an connection between said first and second wiring lines by inserting said connecting means through said through-holes.

7. A semiconductor device comprising: a carrier tape having a first surface and a second surface on opposite sides thereof;

first areas and second areas formed apart from each other on said first surface;

a plurality of sets of first wiring lines, each of said sets being formed on a corresponding one of each of said first areas;

a plurality of sets of second wiring lines, each of said sets being formed on a corresponding one of each of said second areas;

third wiring lines formed on said second surface with an electrical isolation from said sets of said first wiring lines and said sets of said second wiring lines;

each of said third wiring lines extending so as to intersect with each of said sets of said first wiring lines and said sets of said second wiring lines;

semiconductor chips each having electrodes respectively connected to said first wiring lines and said second wiring lines;

first through-holes formed in said carrier tape, each of said first through-holes being disposed at an intersection of an individually associated one of said first wiring lines and an associated one of said third wiring lines, and second through-holes formed in said carrier tape, each of second through-holes being disposed at an intersection of an individually associated one of said second wiring lines and an associated one of said third wiring lines; and means comprising conductors inserted into individual ones of said first and second through-holes for electrically connecting respective ones of said first and second wiring lines to the associated one of said third wiring lines.

8. A semiconductor device as claimed in claim 7, wherein said carrier tape comprises a plurality of device holes in which individually associated one of said semiconductor chips are respectively disposed.

9. A semiconductor device comprising:

a carrier tape having a first main surface and a second surface on opposite sides thereof;

a plurality of device-holes formed at intervals in said carrier tape;

first wiring lines formed on said first main surface, each of said first wiring lines having an end portion projecting over a corresponding one of said device-holes.

a plurality of semiconductor chips disposed in corresponding and individually associated ones of said device-holes, respectively, each of said semiconductor chips having electrodes connected to individually associated one of said end portions of said associated first wiring lines, second wiring lines formed on said second main surface with said first and second wiring lines being electrically isolated from each other;

said second wiring lines intersecting said first wiring layers; and a plurality of through-holes formed in said carrier tape, each of said through-holes being disposed at an individually associated one of said intersections between said first and second wiring lines; and conductor means for insertion into a selected one of said through-holes in order to selectively connect one of said second wiring lines to a corresponding one of said first wiring lines which intersects at said selected through hole.

10. A semiconductor device as claimed in claim 3 wherein said connecting means has electroconductive contact members, and said contact members are inserted into said selected one of said through-holes.

11. A semiconductor device as claimed in claim 1, wherein each of said first wiring lines partially overlaps each of said second wiring lines, and a through-holes at each of said overlap portions, and said connecting means electrically connects said first and second wiring lines to each other via said through-holes, respectively.

12. A semiconductor device as claimed in claim 1, wherein said first wiring lines are arranged at each side of said carrier tape, and said device-holes are disposed at a center of said carrier tape.

13. A semiconductor device as claimed in claim 12, wherein said second wiring lines are arranged at each side of said carrier tape.

14. A semiconductor device as claimed in claim 1, wherein each of said first wiring lines has a terminal formed on said first surface of said carrier tape.

* * * * *